(12) United States Patent
Koo et al.

(10) Patent No.: US 8,404,532 B2
(45) Date of Patent: Mar. 26, 2013

(54) TRANSFERRED THIN FILM TRANSISTOR AND METHOD FOR MANUFACTURING THE SAME

(75) Inventors: Jae Bon Koo, Daejeon (KR); Jong-Hyun Ahn, Gyeonggi-do (KR); Seung Youl Kang, Daejeon (KR); Hasan Musarrat, Daejeon (KR); In-Kyu You, Daejeon (KR); Kyoung Ik Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 462 days.

(21) Appl. No.: 12/782,303

(22) Filed: May 18, 2010

(65) Prior Publication Data
US 2011/0133257 A1 Jun. 9, 2011

(30) Foreign Application Priority Data
Dec. 7, 2009 (KR) .......................... 10-2009-0120621

(51) Int. Cl.
*H01L 21/336* (2006.01)
(52) U.S. Cl. .......................... 438/197; 438/257; 438/478
(58) Field of Classification Search .................. 438/197, 438/257, 478
See application file for complete search history.

(56) References Cited

U.S. PATENT DOCUMENTS

| 6,700,631 | B1 | 3/2004 | Inoue et al. | |
|---|---|---|---|---|
| 2005/0148147 | A1* | 7/2005 | Keating et al. | 438/299 |
| 2006/0115949 | A1* | 6/2006 | Zhang et al. | 438/300 |
| 2006/0145273 | A1* | 7/2006 | Curello et al. | 257/410 |
| 2007/0018205 | A1* | 1/2007 | Chidambarrao et al. | 257/288 |
| 2007/0032089 | A1 | 2/2007 | Nuzzo et al. | |
| 2009/0199960 | A1 | 8/2009 | Nuzzo et al. | |

FOREIGN PATENT DOCUMENTS
EP 1443556 A2 8/2004
KR 10-0569881 4/2006

OTHER PUBLICATIONS

S. Mack et al., "Mechanically flexible thin-film transistors that use ultrathin ribbons of silicon derived from bulk wafers", Applied Physics Letters, vol. 88, p. 213101-1-213101-3 (2006).
Jong-Hyun Ahn et al., "High-speed Mechanically Flexible Single-Crystal Silicon Thin-Film Transistors on Plastic Substrates", IEEE Electron Device Letters, vol. 27, No. 6, p. 460-462 (2006).
Satoshi Inoue et al., "Surface-Free Technology by Laser Annealing (SUFTLA) and Its Application to Poly-Si TFT-LCDs on Plastic Film With Integrated Drivers", IEEE Transactions on Electron Devices, vol. 49, No. 8, p. 1353-1360 (2002).
Tatsuya Shimoda et al., "Surface Free Technology by Laser Annealing (SUFTLA)", IEDM99-289, p. 12.1.1-12.1.4 (1999).

* cited by examiner

*Primary Examiner* — Jae Lee
(74) *Attorney, Agent, or Firm* — Rabin & Berdo, P.C.

(57) ABSTRACT

Provided are a transferred thin film transistor and a method of manufacturing the same. The method includes: forming a source region and a drain region that extend in a first direction in a first substrate and a channel region between the source region and the drain region; forming trenches that extend in a second direction in the first substrate to define an active layer between the trenches, the second direction intersecting the first direction; separating the active layer between the trenches from the first substrate by performing an anisotropic etching process on the first substrate inside the trenches; attaching the active layer on a second substrate; and forming a gate electrode in the first direction on the channel region of the active layer.

12 Claims, 19 Drawing Sheets

TRANSFERRED THIN FILM TRANSISTOR AND METHOD FOR MANUFACTURING THE SAME

CROSS-REFERENCE TO RELATED APPLICATIONS

This U.S. non-provisional patent application claims priority under 35 U.S.C. §119 of Korean Patent Application No. 10-2009-0120621, filed on Dec. 7, 2009, the entire contents of which are hereby incorporated by reference.

BACKGROUND OF THE INVENTION

The present invention disclosed herein relates to a transferred thin film transistor and a method of manufacturing the same, and more particularly, to a thin film transistor transferred on a plastic substrate and a method of manufacturing the same.

In general, an Organic Thin Film Transistor (OTFT) is extensively used in a flexible display driving device or a Radio Frequency Identification (RFID) application device. When an organic material is used for a channel layer in the OTFT, since conduction mechanism and crystallity are defective, more than 1 $cm^2/Vs$ mobility may not be easily realized. Although the OTFT is used for realizing a flexible electronic device, since it has short life cycle and deterioration of driving reliability when being exposed to atmosphere, it is difficult to achieve mass production.

Accordingly, due to a technical deadlock state of the OTFT with limitations related to a life cycle and reliability and its increased demand for a special purpose high-speed flexible device, recently suggested is an alternative technique in which an existing silicon substrate semiconductor is detached from a wafer substrate and is transferred on a plastic substrate.

SUMMARY OF THE INVENTION

The present invention provides a thin film transistor transferred on a plastic substrate and a method of manufacturing the same.

Embodiments of the present invention provide methods of manufacturing a transferred thin film transistor, the methods including: forming a source region and a drain region that extend in a first direction in a first substrate and a channel region between the source region and the drain region; forming trenches that extend in a second direction in the first substrate to define an active layer between the trenches, the second direction intersecting the first direction; separating the active layer between the trenches from the first substrate by performing an anisotropic etching process on the first substrate inside the trenches; attaching the active layer on a second substrate; and forming a gate electrode in the first direction on the channel region of the active layer.

In some embodiments, the first substrate may include a silicon wafer having a 100 shaped plane.

In other embodiments, the trenches may have a V-shape, and slopes of the V-shaped trenches may include a 111 shaped plane and a 111 shaped plane.

In still other embodiments, the trenches may be formed through a wet etching method.

In even other embodiments, the wet etching method may use Tetramethyl Ammonium Hydroxide (TMAH) as an etchant.

In yet other embodiments, the separating of the active layer may include: forming a photoresist pattern on the active layer between the trenches; and removing the first substrate in the trenches until adjacent trenches are contacted each other by the anisotropic etching process that uses the photoresist pattern as an etching mask.

In further embodiments, the anisotropic etching process may include a dry etching method.

In still further embodiments, the dry etching method may use SF6 as an etching gas of the first substrate.

In even further embodiments, the photoresist pattern may be formed to have a shade that extends into the trenches on the active layer.

In yet further embodiments, the shade may be formed by reflowing the photoresist pattern on the active layer.

In ye further embodiments, the separating of the active layer may include: attaching a stamp on the photoresist pattern after the removing of the first substrate in the trenches; and separating the photoresist pattern and the active layer from the first substrate.

In ye further embodiments, the methods further may include performing a thermal treatment process of more than about 500° C. on the first substrate after the forming of the source/drain impurity regions.

In other embodiments of the present invention, transferred thin film transistors include: a substrate; an adhesive layer on the substrate; an active layer formed with an inverted triangle shape having a plurality of slopes buried in the adhesive layer, and including a source region and a drain region, source/drain impurity regions on the active region; and a gate electrode on a channel region between the source region and the drain region.

In some embodiments, a top surface of the active layer may have a 100 shaped flat plane.

In other embodiments, the slope of the active layer may have a 111 shaped plane and a 111 shaped plane.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

The objects, other objectives, features, and advantages of the present invention will be understood without difficulties through preferred embodiments below related to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the specification, it will be understood that when a layer (or film) is referred to as being 'on' another layer or substrate, it can be directly on the other layer or substrate, or intervening layers may also be present. Also, in the figures, the dimensions of layers and regions are exaggerated for clarity of illustration. Also, though terms like a first, a second, and a third are used to describe various regions and layers in various embodiments of the present invention, the regions and the layers are not limited to these terms. These terms are used only to discriminate one region or layer from another region or layer. An embodiment described and exemplified herein includes a complementary embodiment thereof.

Hereinafter, a transferred thin film transistor and a method of manufacturing the same will be described according to an embodiment of the present invention with reference to the accompanying drawings.

FIGS. 1 through 18 are manufacturing sectional views illustrating a method of manufacturing a transferred thin film transistor according to an embodiment of the present invention.

Figure 1:
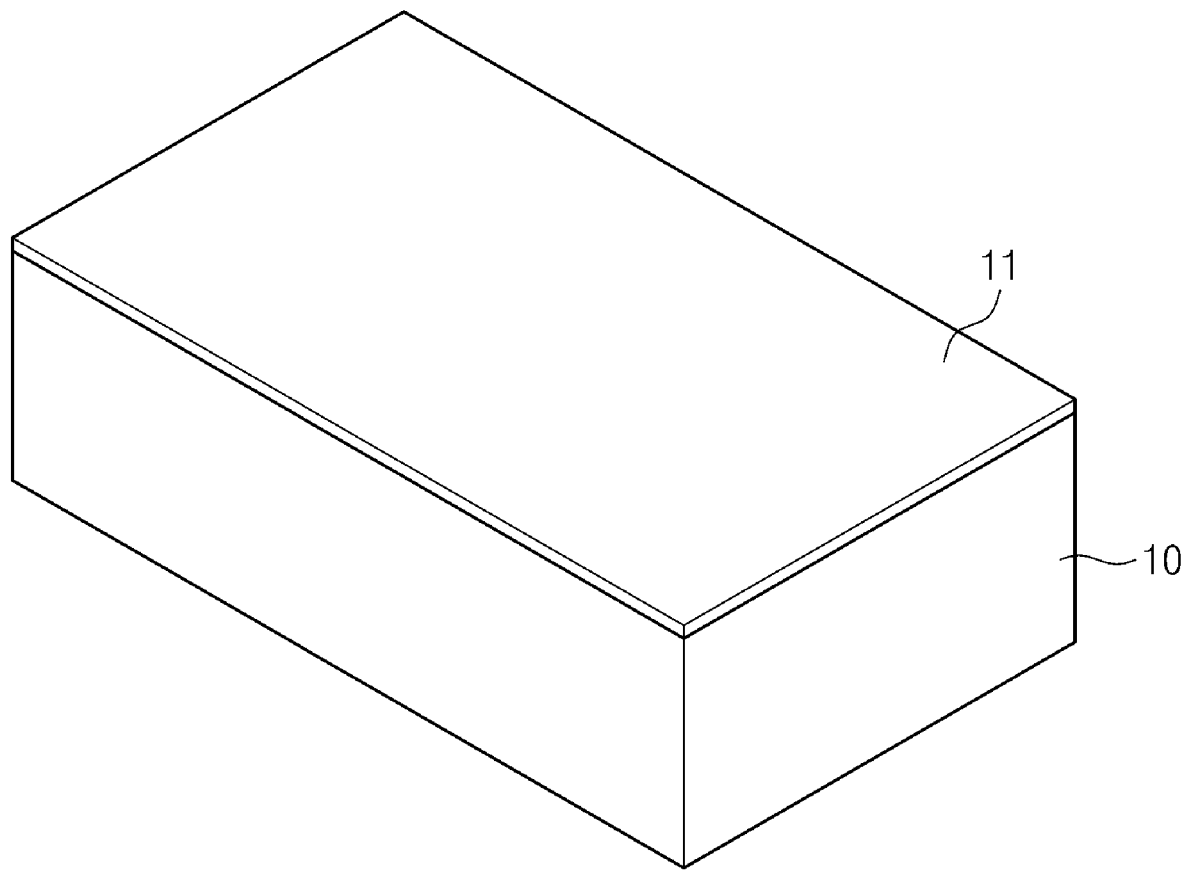
FIGS. 1 through 18 are manufacturing sectional views illustrating a method of manufacturing a transferred thin film transistor according to an embodiment of the present invention.

Referring to FIG. 1, according to the method of manufacturing a transferred thin film transistor, a first hard mask layer 11 may be formed on a first substrate 10. Here, the first substrate 10 may include a silicon wafer having a 100 shaped plane. Since the 100 shaped silicon wafer has higher chemical stability and repeatability of cleavage compared to a 111 shaped silicon wafer, it is mostly used in a semiconductor production line and is commercially distributed with moderate prices. A first hard mask layer 11 includes a silicon oxide layer formed by using a Plasma Enhanced Chemical Vapor Deposition (PECVD) method and is formed with a thickness of about 100 nm to about 300 nm.

Figure 2:
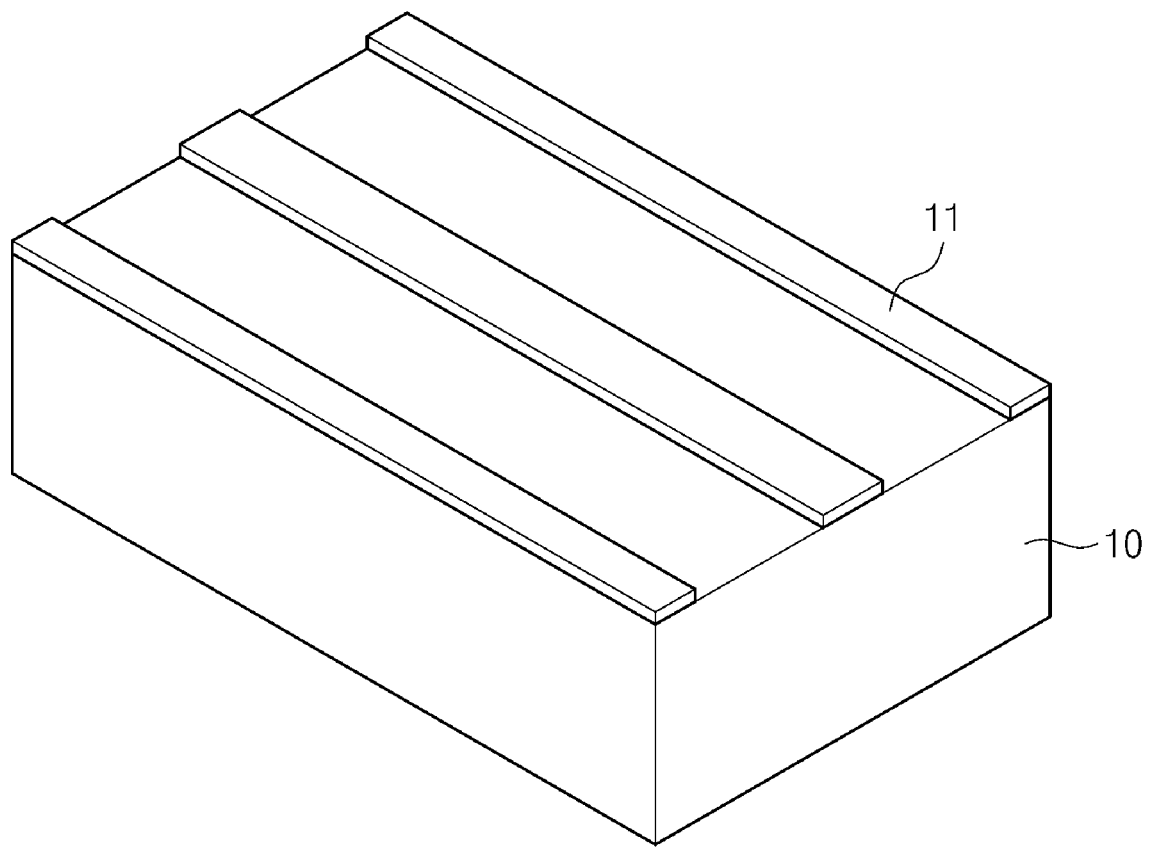

Referring to FIG. 2, the first hard mask layer 11 is patterned to extend in a first direction on the first substrate 10. The first hard mask layer 11 may be patterned in the first direction through a photolithography process and an etching process. At this point, the first hard mask layer 11 may define a channel region between source/drain impurity regions of a thin film transistor.

Figure 3:
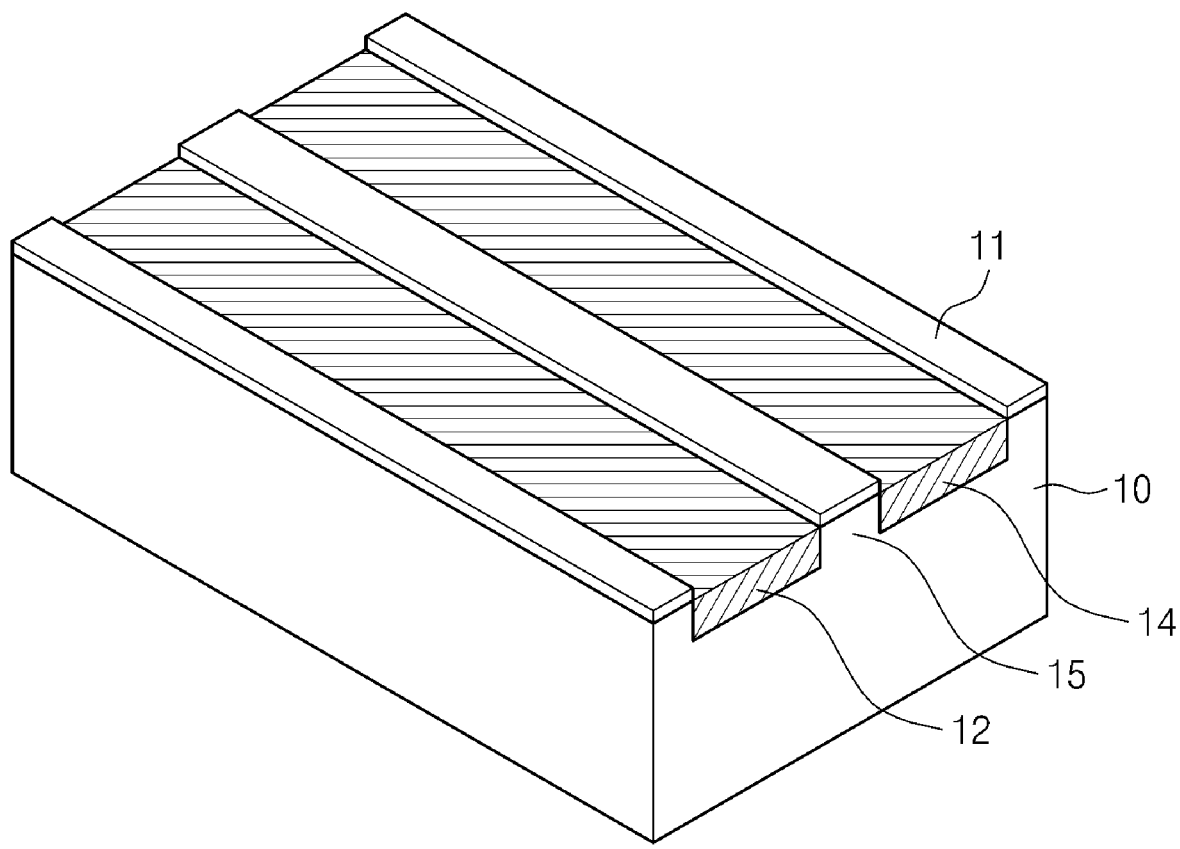

Referring to FIG. 3, the source/drain impurity regions 12 and 14 are formed in the first substrate 10 through an ion implantation method using the first hard mask layer 11 as a mask. The source/drain impurity regions 12 and 14 may be doped with a conductive impurity of about 1×1015 EA/cm3 to about 1×1017 EA/cm3. The conductive impurity may include a p-type impurity of group 111 elements such as B, Ga, and In, and an n-type impurity of group V elements such as As, P, and Sb, based on kinds of a plurality of carriers that travel in a thin film transistor. The surface of the first substrate 10 between the source/drain impurity regions 13 and 14 may be a channel region 15 of the thin film transistor. The line width of the channel region 15 may be determined by the first hard mask layer 11.

Figure 4:
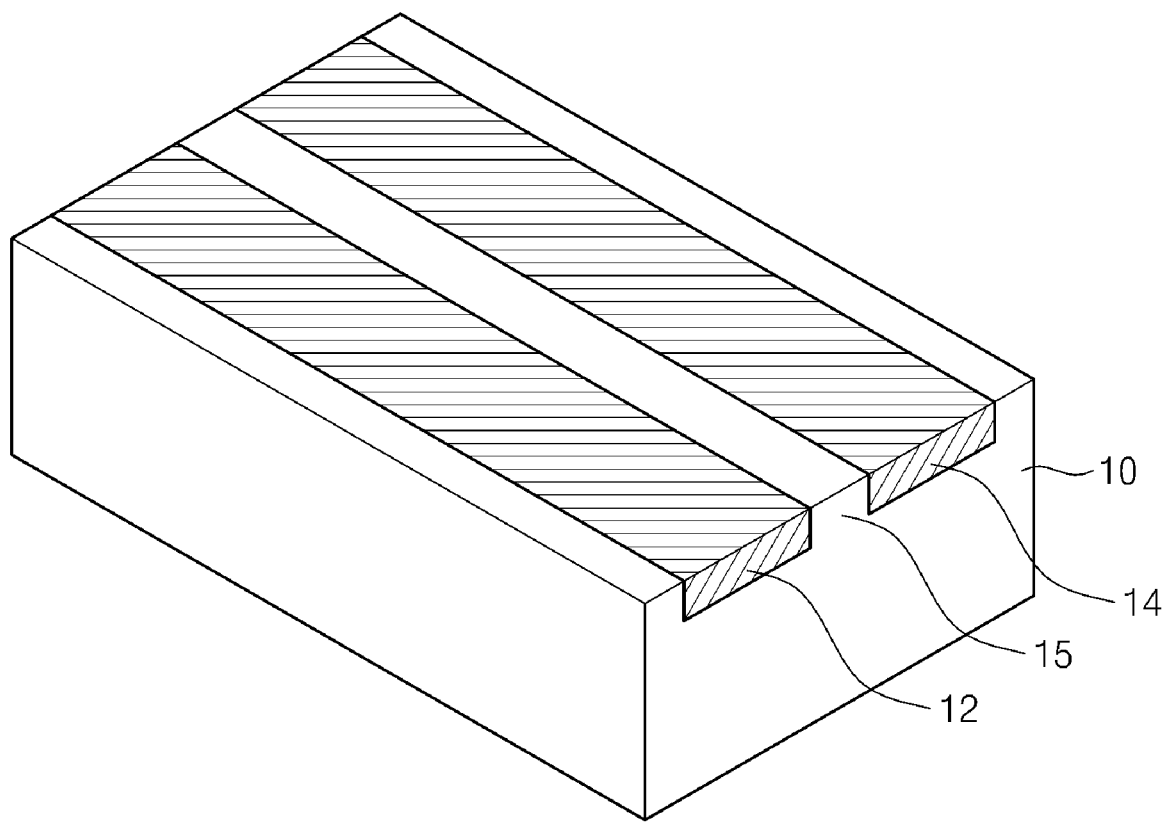

Referring to FIG. 4, the conductive impurity doped in the source/drain impurity regions 12 and 14 can be activated by removing the first hard mask layer 11 and performing a thermal treatment on the first substrate 10. Here, the thermal treatment of the first substrate 10 may be performed at a temperature of about 500° C. to about 700° C. Thus, the method of manufacturing a thin film transistor according to the embodiment of the present invention may be performed the thermal treatment activating the conductive impurity doped in the source/drain impurity regions 12 and 14 on the first substrate 10.

Figure 5:
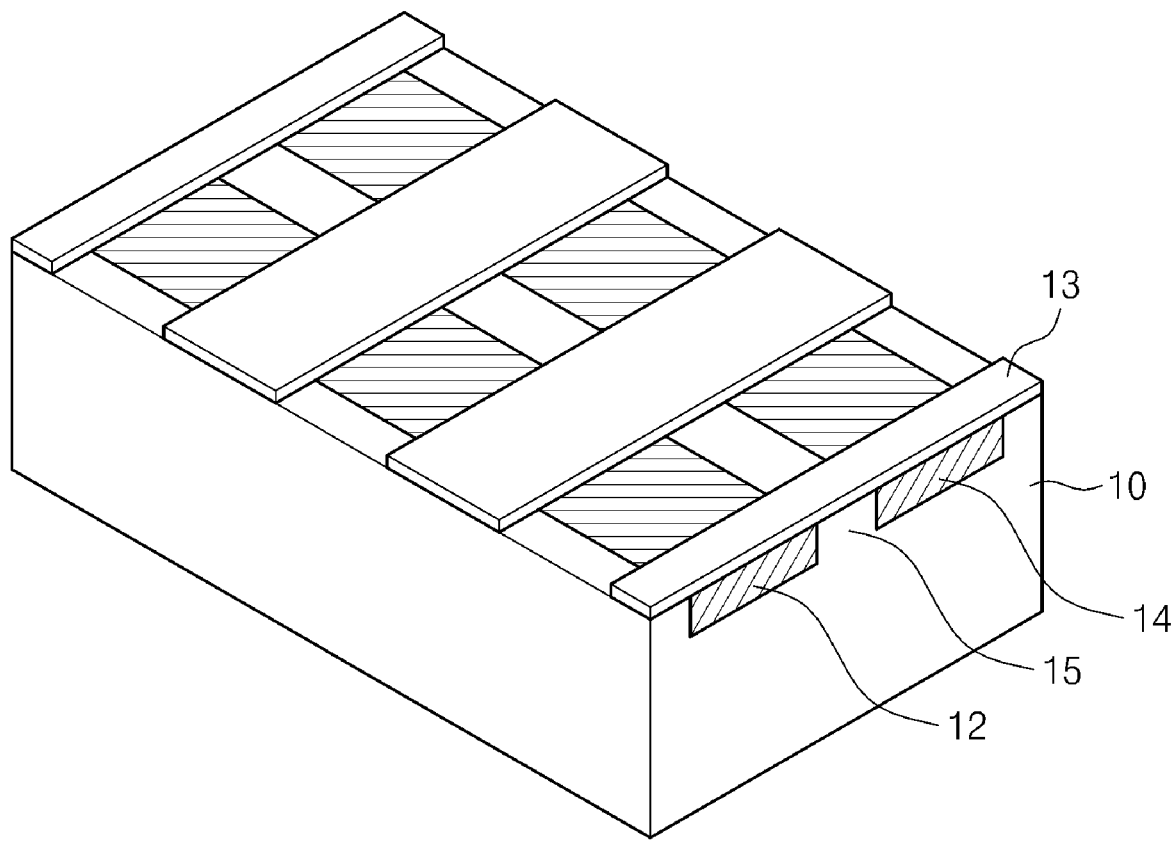

Referring to FIG. 5, a second hard mask layer 13 is formed. The second hard mask layer 13 extends in a second direction intersecting the first direction where the source/drain impurity regions 12 and 14 are formed. The second hard mask layer 13 may include a silicon oxide layer formed by using a PECVD method. The second hard mask layer 13 is formed with a thickness of about 50 nm to about 100 nm and is patterned in the second direction through a photolithography process and an etching process. The second hard mask layer 13 may be patterned by a reactive ion etch (RIE) using an etching gas such as HF in an ion beam of a plasma state.

Figure 6:
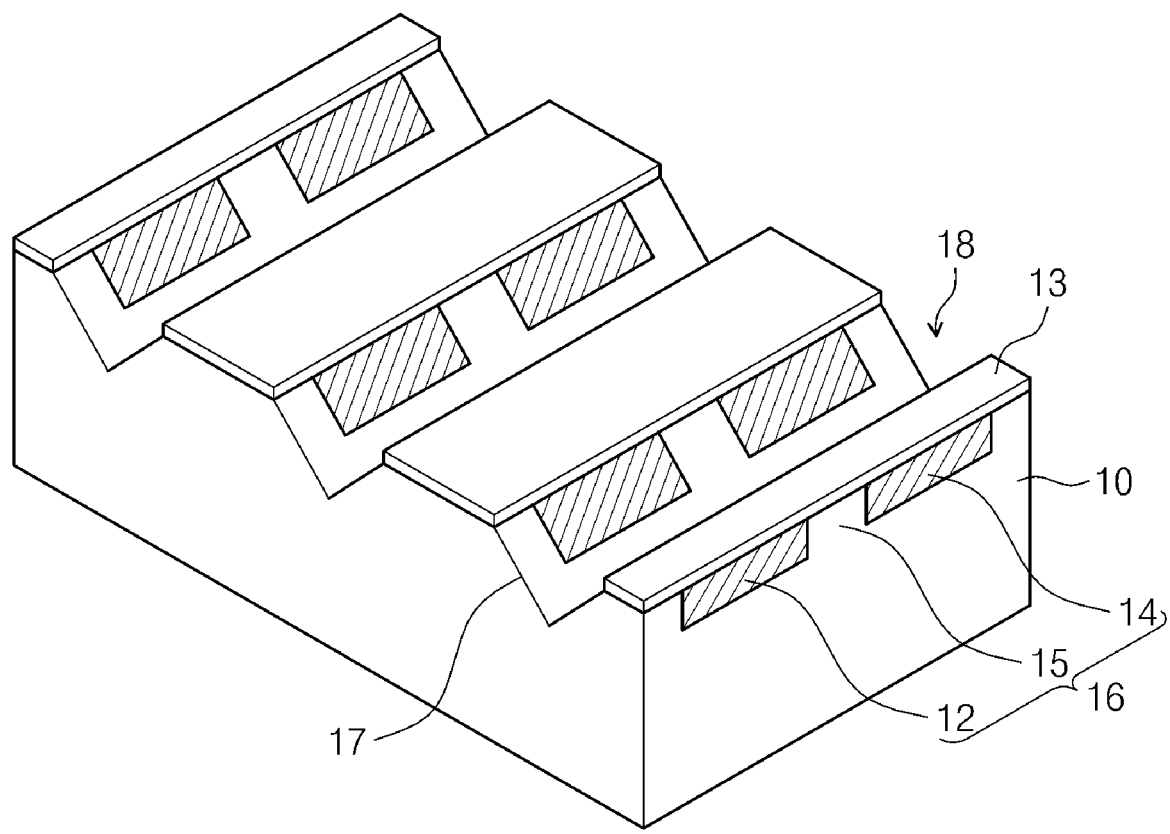

Referring to FIG. 6, the first substrate 10 exposed through the second hard mask layer 13 is removed at a predetermined depth to form a trench 18. The trench 18 may be formed by a wet etching method that uses the second hard mask layer 13 as an etching mask. The wet etching method may use Tetramethyl Ammonium Hydroxide (TMAH) as an etchant. For example, the trench 18 may be formed at the depth of about 100 nm to about 200 nm by an etching process, which is performed for about 4 min in the heated etchant of about 100° C. The trench 18 may be formed with a V-shape. The slope 17 of the trench 18 may be formed with a 111 shaped plane and a 111 shaped plane. The first substrate 10 below the second hard mask layer 13 may be an active layer 16 where at least one thin film transistor is formed. The active layer 16 may include the source/drain impurity regions 12 and 14 and the channel region 15.

Figure 7:
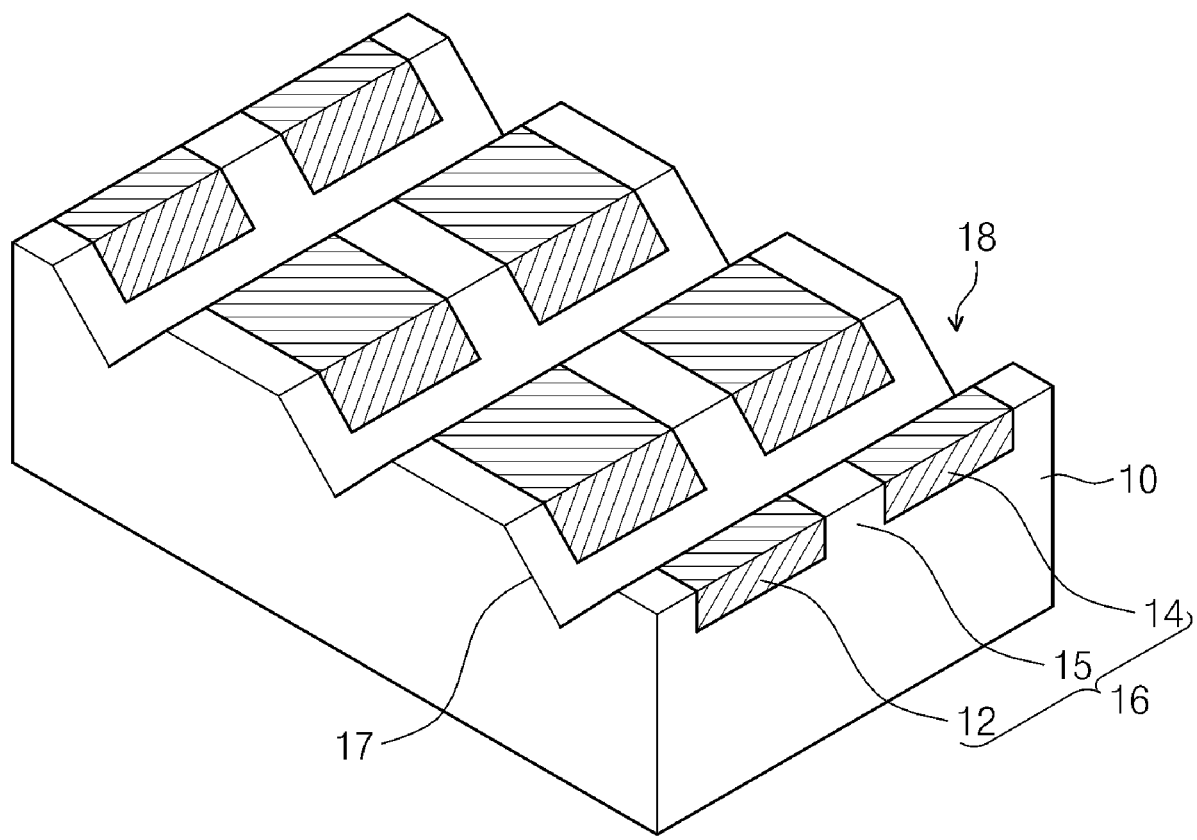

Referring to FIG. 7, the second hard mask layer 13 may be removed. The second hard mask layer 13 may be removed by a Buffer Oxide Etchant (BOE), i.e., a mixture of NH4F and HF.

Figure 8:
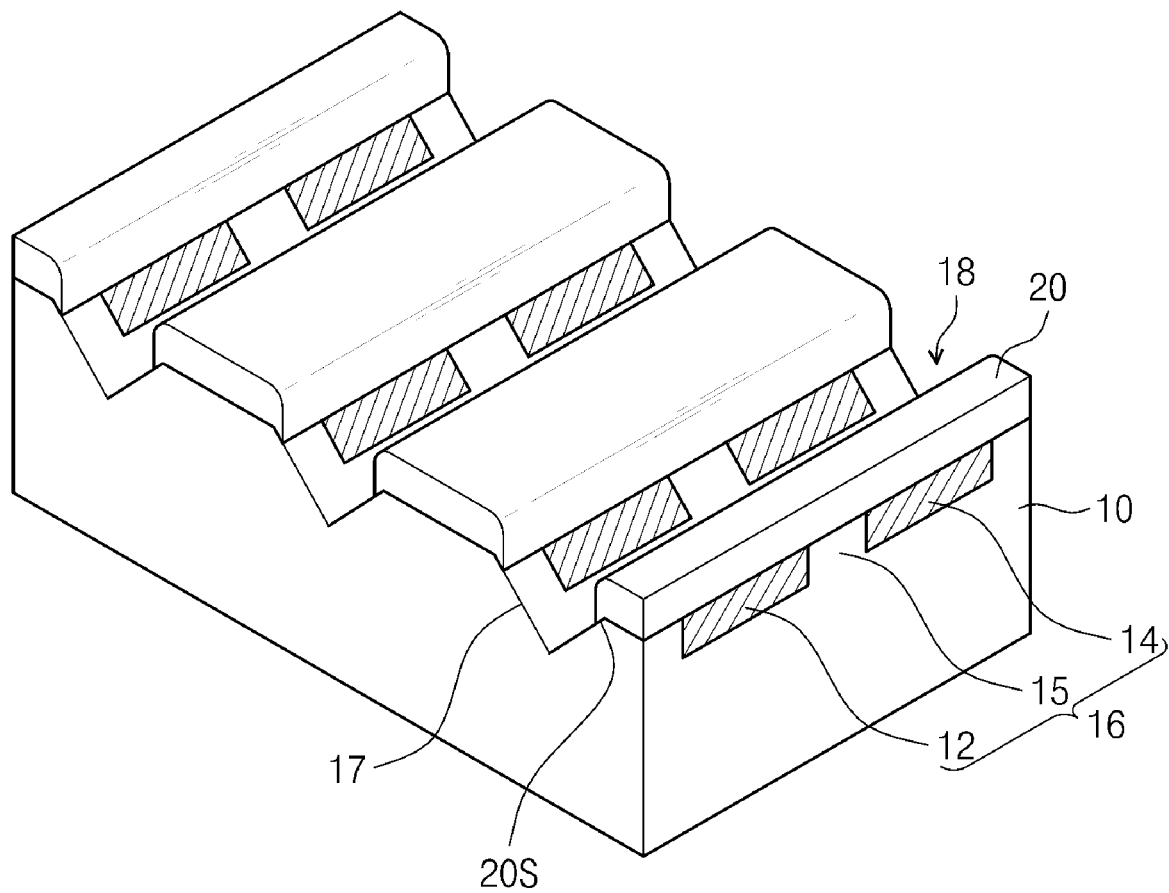

Referring to FIG. 8, a photoresist pattern 20 may be formed on the active layer 16 between the trenches 18. Here, the photoresist pattern 20 may include a shade 20S covering the edge of the trench 18. The photoresist pattern 20 may be patterned by a photolithography process in which a photoresist coated on the first substrate 10 is exposed and is hard-baked after the exposed photoresist is developed. As mentioned above, the photoresist pattern 20 may be formed with the shade 20S covering the active layer 16 between the trenches 18 and also covering the edge of the trench 18. The shade 20S of the photoresist pattern 20 is formed through a photolithography process or a reflow process that is added after the photolithography process. For example, during the reflow process, the photoresist pattern 20 is heated for about 5 sec to about 10 sec at a temperature of about 120° C. to about 150° C. to reflow the photoresist pattern 20 at the edge of the trench 18.

Figure 9:
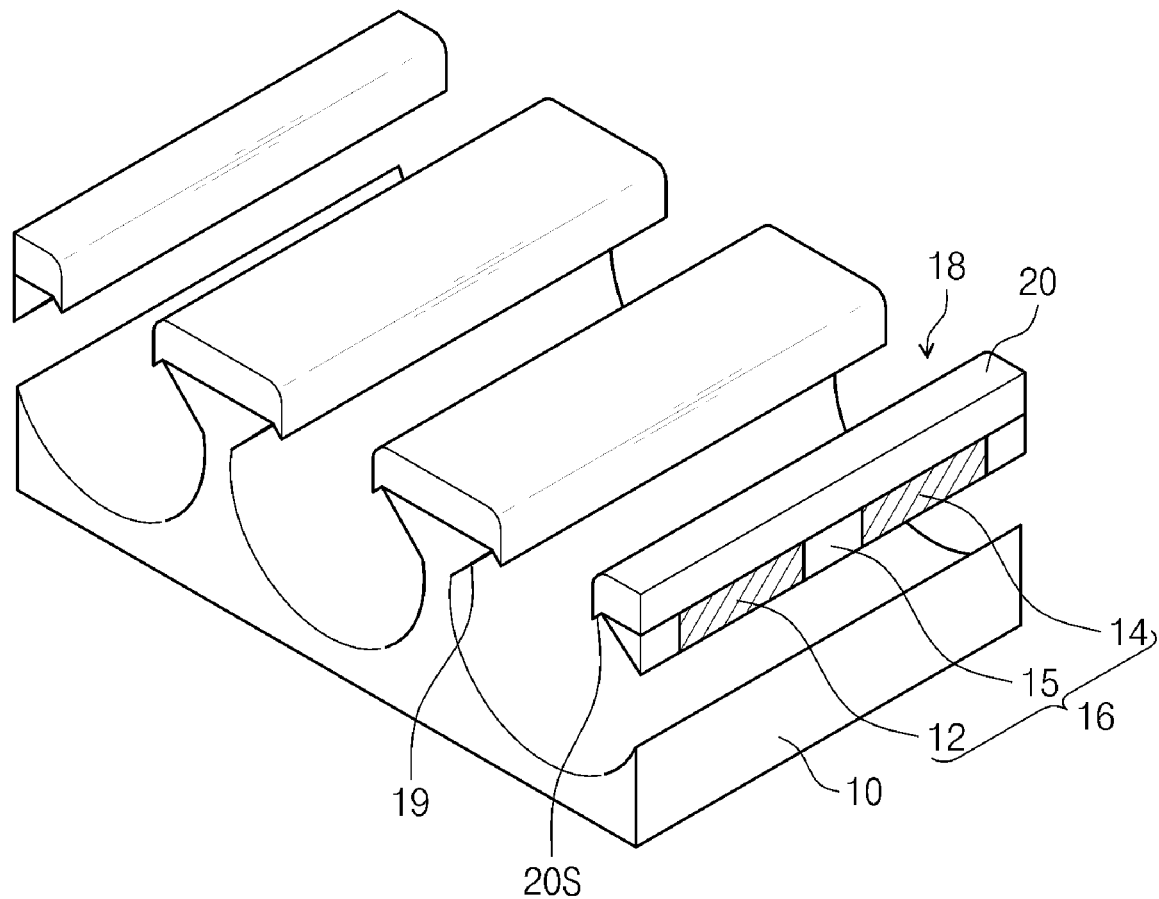

Referring to FIG. 9, until necking of adjacent trenches 18 occurs, an anisotropic etching process using the photoresist pattern 20 as an etching mask is performed to remove the first substrate 10, such that the active layer 16 is separated from the first substrate 10. Here, the anisotropic etching process may be performed through a dry etching method including a dry etching process that uses SF6 gas as an etching gas As mentioned above, the first substrate 10 may include a silicon wafer having a 100 shaped plane. The anisotropic dry etching process may etch the first substrate 10 in a direction vertical to the slope 17 of the trench 18 having a 111 shaped plane and a 111 shaped plane inside the trench 18. Accordingly, the dry etching method may remove the first substrate 10 exposed by the photoresist pattern 20 in the trench 18. Furthermore, the dry etching method may prevent that the active layer 16 below the photoresist pattern 20 is etched more overwhelming than an isotropic wet etching method. The active layer 16 may be formed with an inverted triangle shape that protrudes to the bottom by a dry etching method. The slope 19 of the active layer 16 may be formed with a 111 shaped plane and 111 shaped plane.

Figure 19:
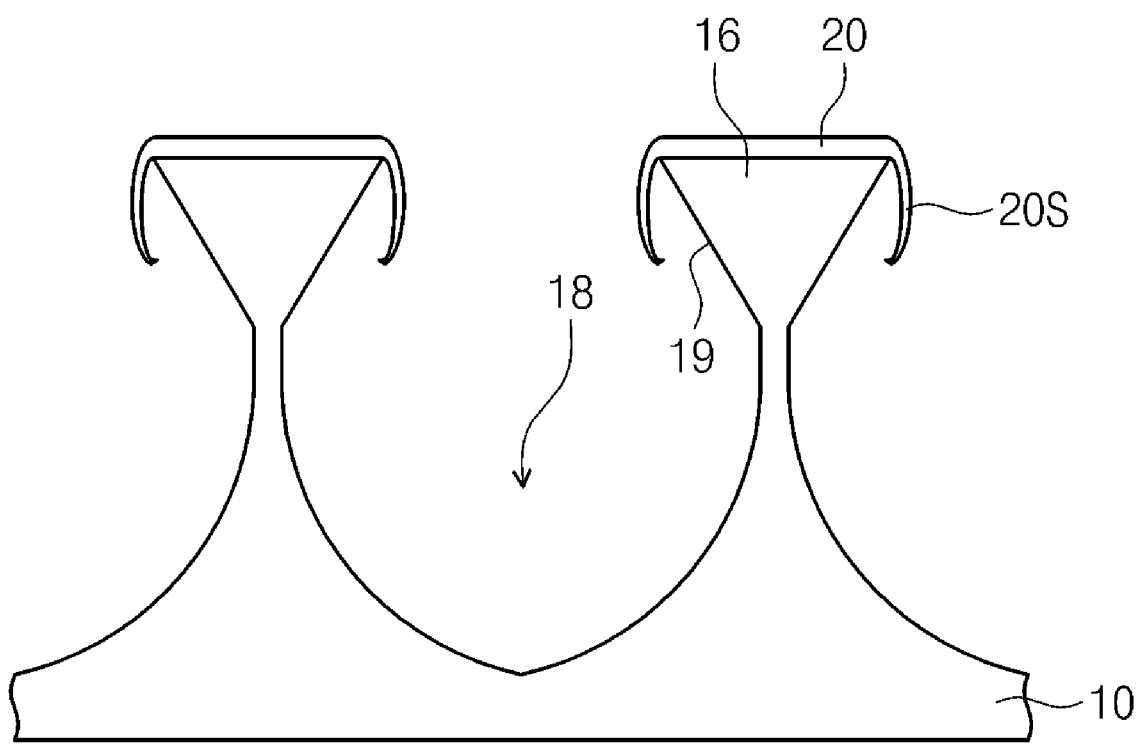
FIG. 19 is a view illustrating an etching process of a trench 18 shown in FIG. 9.

FIG. 19 is a view illustrating an etching process of the trench 18 shown in FIG. 9. It shows that when the first substrate 10 exposed by the trench 18 is etched by using a dry etching method, the active layer 16 below the photoresist pattern is partially etched. During the etching process, the photoresist pattern 20 is formed with a structure surrounding the edge of the active layer 16.

Accordingly, the method of manufacturing a transferred thin film transistor removes the first substrate 10 exposed by the trench 18 through a dry etching method to separate the active layer 16 from the first substrate 10.

Next, a hard bake process may be further performed on the photoresist pattern 20 that is damaged and hardened by an etching process.

Figure 10:
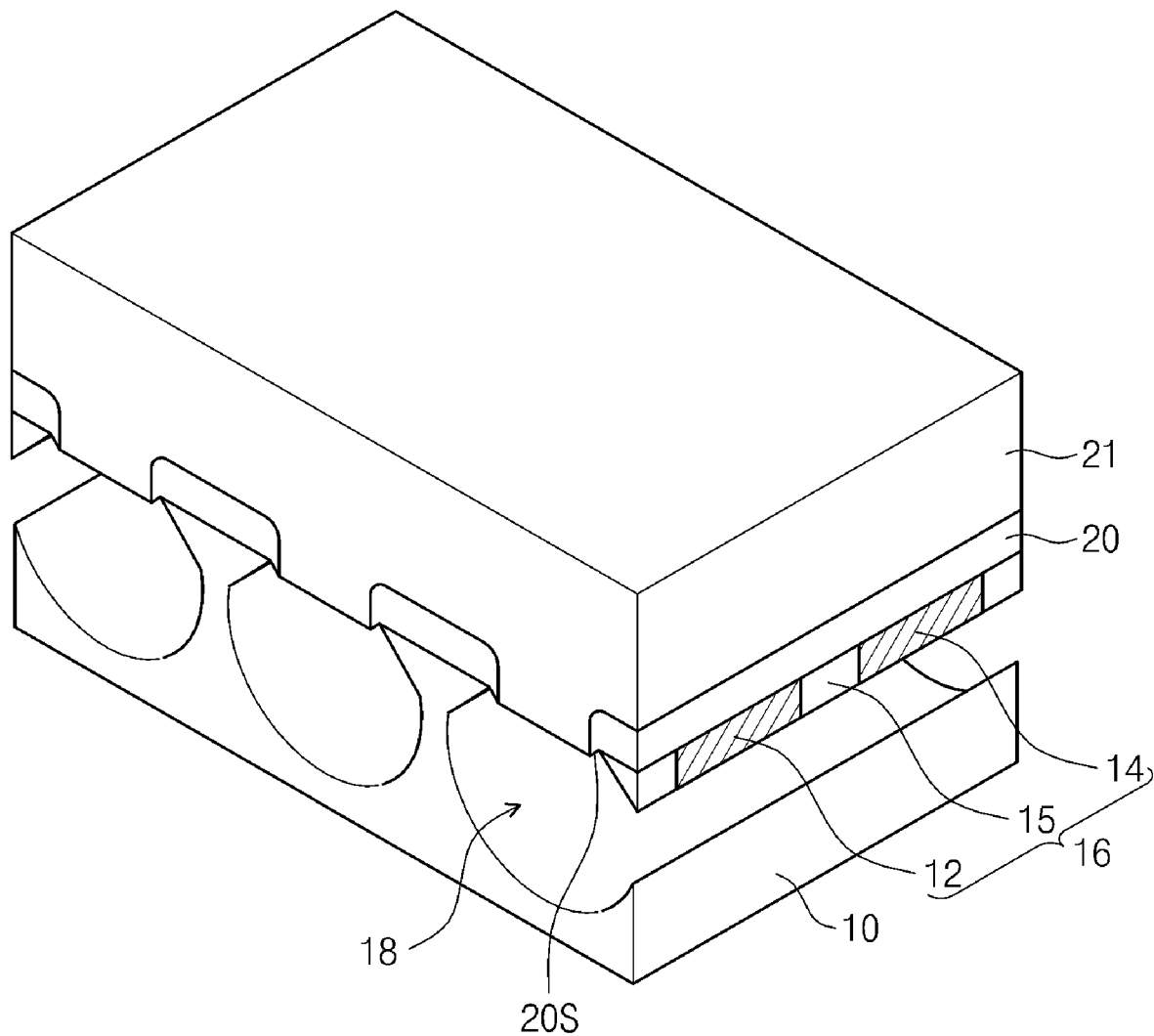

Referring to FIG. 10, a stamp 21 may be attached on the active layer 16 and the photoresist pattern 20. Here, the stamp 21 is attached to the photoresist pattern 20 and physically fixes the active layer 16 below the photoresist pattern 20. For example, the stamp 21 may include the photoresist pattern 20 and a Polydimethylsiloxane (PDMS) substrate having excellent adhesiveness or a glass substrate having an adhesive material with the PDMS.

Figure 11:
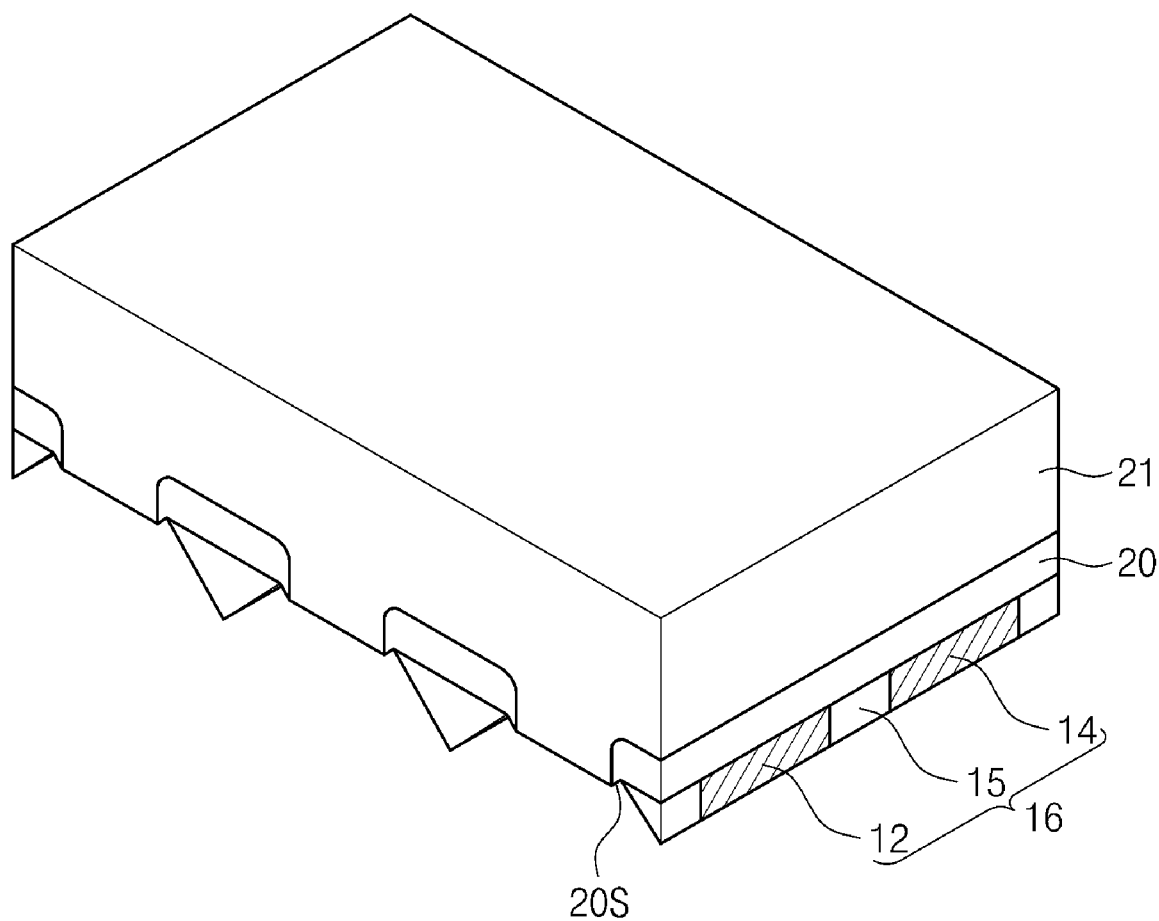

Referring to FIG. 11, the active layer 16 fixed by the stamp 21 may be separated from the first substrate 10. Here, the active layer 16 may be already separated from the first substrate 10 by the trench 18, or may be separated from the first substrate 10 due to an external power applied to the stamp 21. Since the silicon wafer of a 100 shaped plane has an excellent cleavage characteristic of a parallel direction, the active layer 16 having a flat section can be separated.

Figure 12:
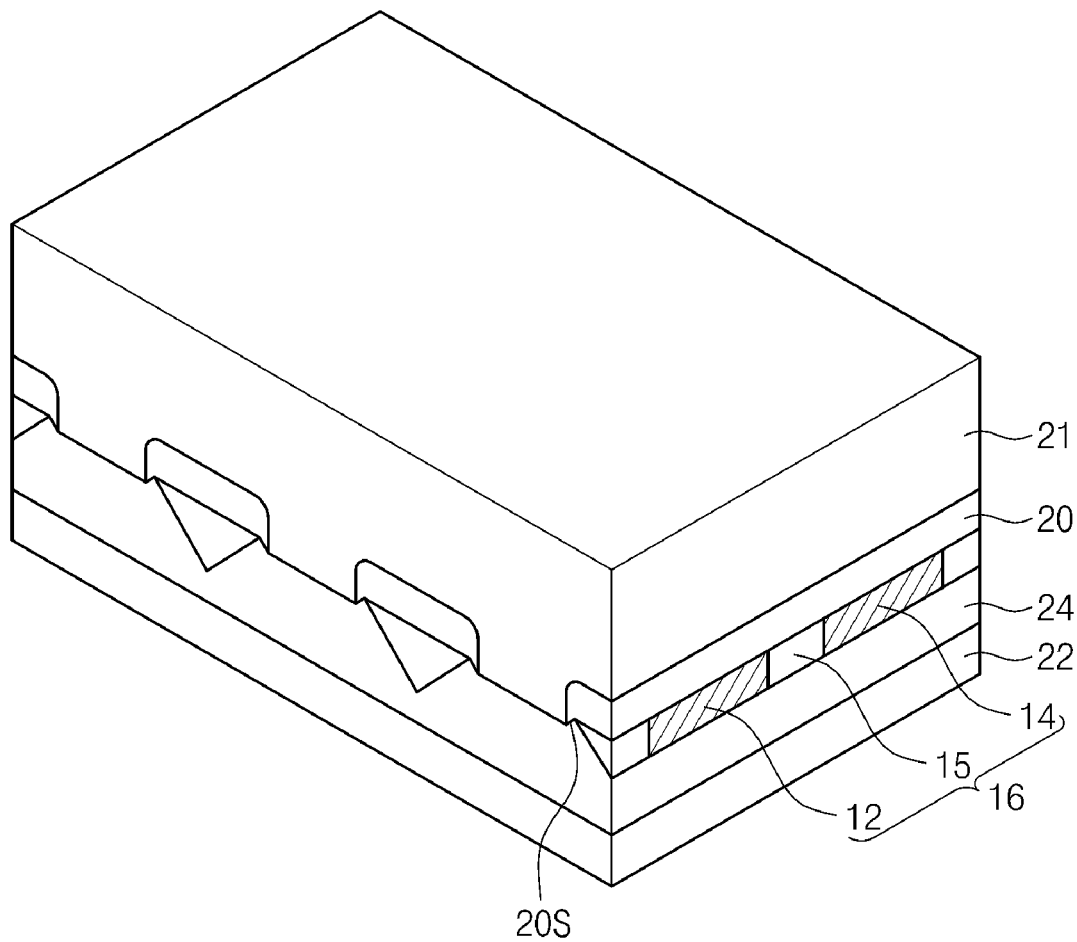

Referring to FIG. 12, the active layer 16 is attached to the second substrate 22 where an adhesive 24 is formed. Here, the adhesive 24 may include Norland Optical Adhesive (NOA) hardened by UltraViolet (UV). In addition, the second substrate 22 may include a flexible substrate of a transparent plastic material. The adhesive 24 may be formed with a height at which the active layer 16 (having an inverted triangle and protruding to the bottom) may be buried by the adhesive 24. That is, the adhesive 24 needs to be formed with a thickness corresponding to the height of the active layer 16. For example, the adhesive 24 is formed by spin coating on the second substrate 22. The adhesive 24 is formed with a thickness of about 0.1 µm to about 10 µm for about 30 sec at a speed of about 3000 rpm to about 4000 rpm. Then, the adhesive 24 is cured for about 50 sec primarily. Next, after the stamp 21 and the second substrate 22 are aligned and the active layer 16 is attached to the second substrate 22, secondary curing is performed for about 5 min.

Figure 13:
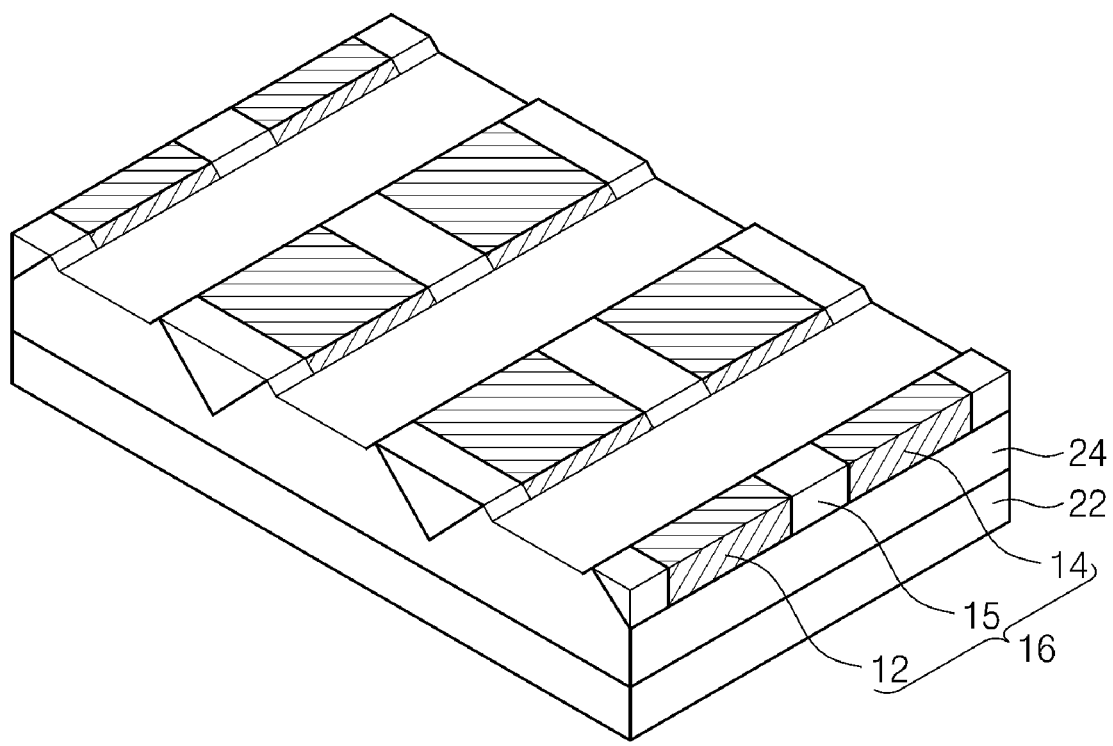

Referring to FIG. 13, the active layer 16 may be exposed by removing the stamp 21 and the photoresist pattern 20. The stamp 21 and the photoresist pattern 20 may be easily removed by a volatile solvent such as alcohol. Since the photoresist pattern 20 may be exposed to UV provided during the curing process of the adhesive 24, it may be removed by a developer. The adhesive 24 of an NOA material may have corrosion resistance with respect to alcohol or developer. At this point, the second hard mask layer 13 remaining on the active layer 16 may be removed. However, the active layer 16 may not be free from a damage caused by etching of the second hard mask layer 13. For example, when the second hard mask layer 13 is removed using BOE after the separating of the active layer 16, an entire surface of the active layer 16 is exposed to an etchant, such that it may be easily damaged. Additionally, while an etching process is performed to separate the active layer 16 from the first substrate 10, the line width of the active layer 16 is reduced and its inverted triangle edge portion is formed angularly. The line width of the active layer 16 separated from the first substrate 10 is reduced more and its edge potion is seriously damaged during the removing of the second hard mask layer 13. Accordingly, the second hard mask layer 13 needs to be removed before the active layer 16 is separated.

Figure 14:
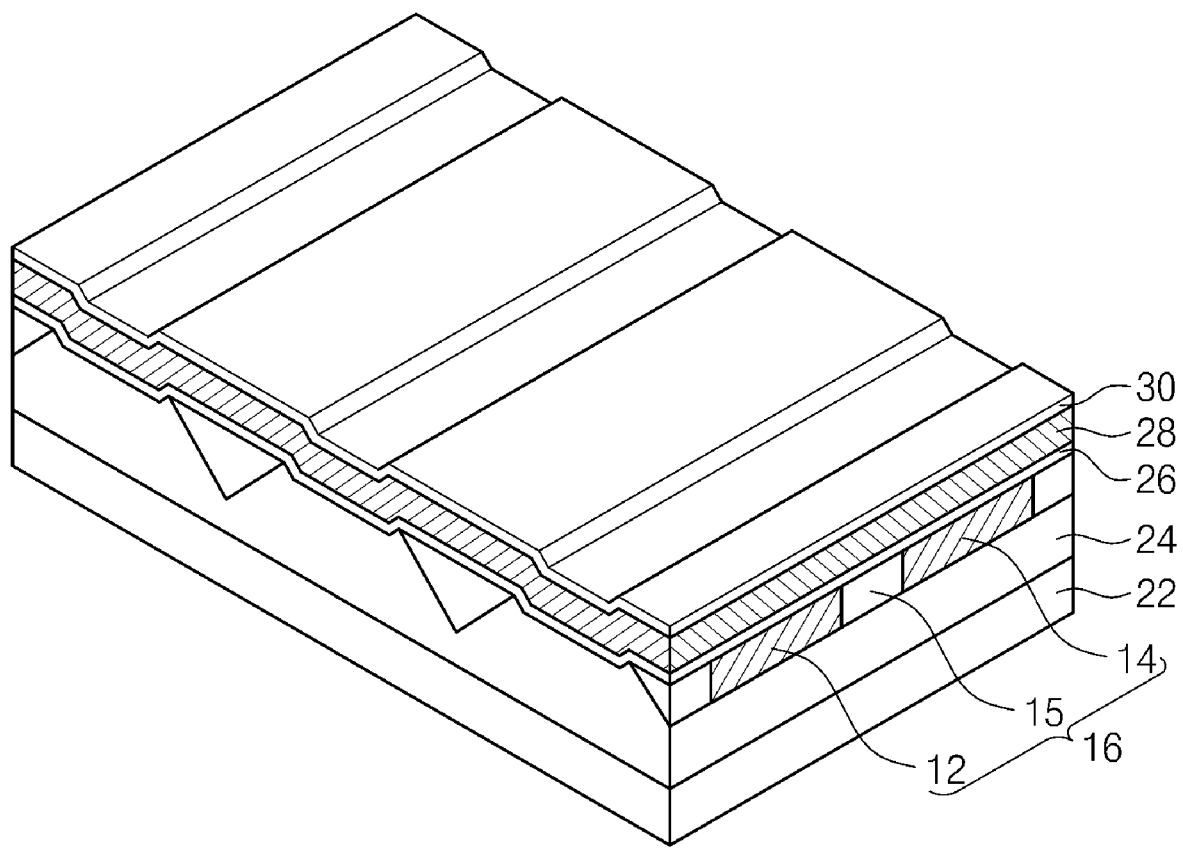

Referring to FIG. 14, a gate insulation layer 26, a gate electrode 28, and a gate upper insulation layer 30 may be sequentially stacked on the second substrate 22. The gate insulation layer 26 and the gate upper insulation layer 30 may include a silicon oxide layer or a silicon nitride layer, which is formed by using a Chemical Vapor Deposition (CVD) method. The gate electrode 28 may include at least one of a poly silicon layer doped with conductive impurity, tungsten silicide, tungsten, gold, silver, copper, and aluminum. The gate insulation layer 26, the gate electrode 28, and the gate upper insulation layer 30 may be formed in-situ in one chamber.

Figure 15:
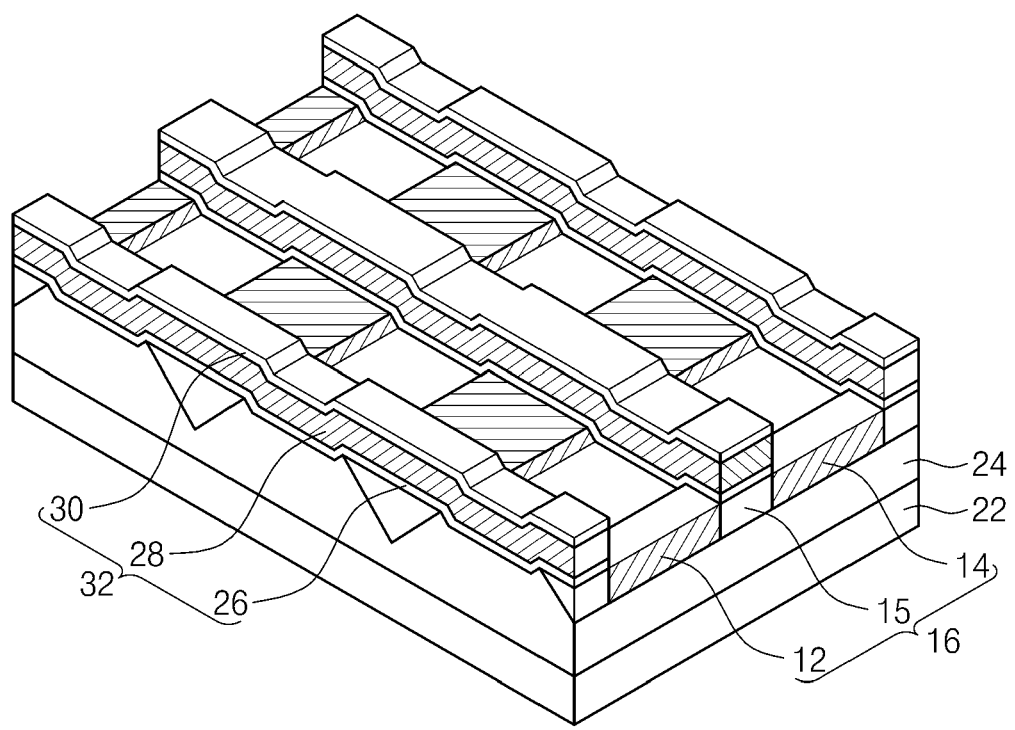

Referring to FIG. 15, a gate stack 32 extending in a first direction may be formed by patterning the gate insulation layer 26, the gate electrode 28, and the gate upper insulation layer 30. The gate stack 32 may extend in a first direction along the channel region 15 between the source/drain impurity regions 12 and 14. Here, the gate electrode 28 of the gate stack 32 may become a gate line or a word line.

Although not shown in the drawings, a spacer may be further formed on the sidewall of the gate stack 32 to prevent it from being exposed during a process for forming a next contact hole.

Figure 16:
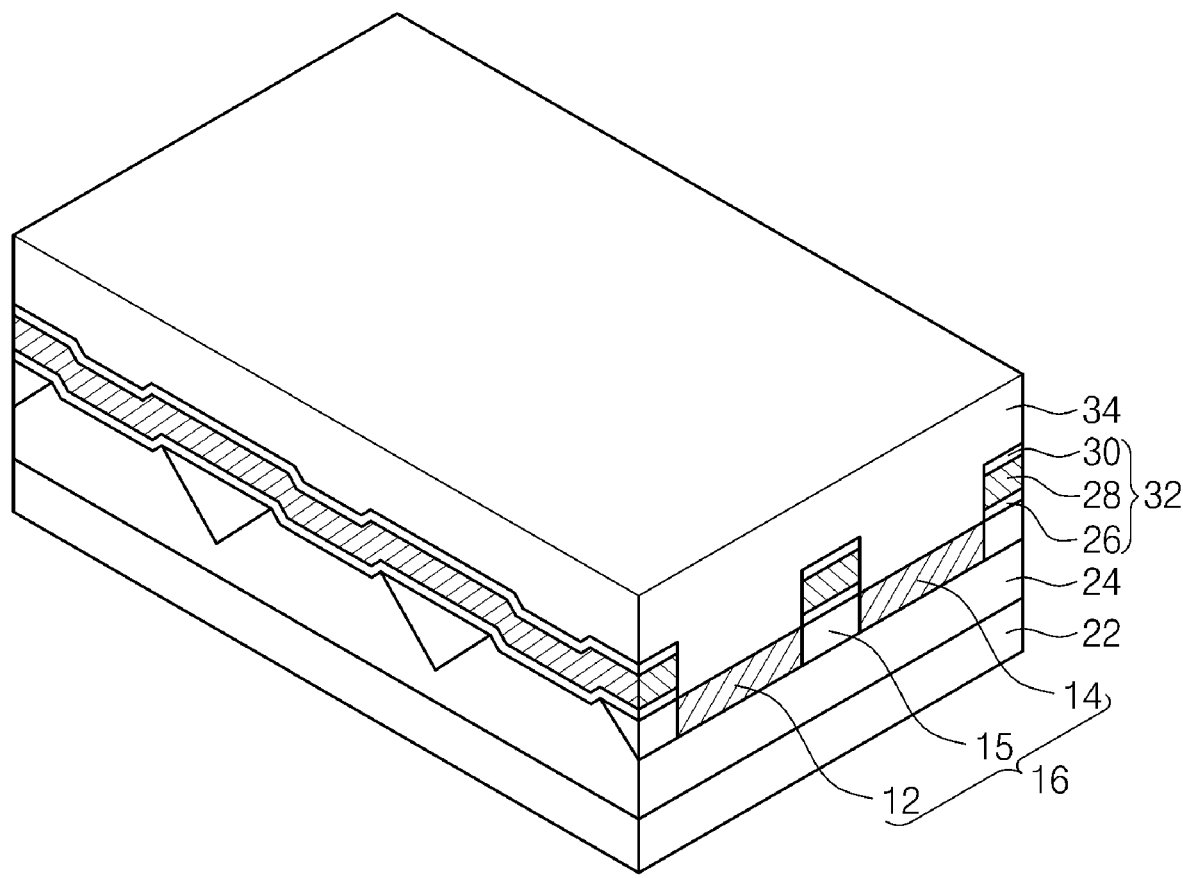

Referring to FIG. 16, an interlayer insulation layer 34 is formed on the second substrate 22. The interlayer insulation layer may include a silicon oxide layer formed by using a CVD method. The interlayer insulation layer 34 may bury the gate stack 32 at a depth of about 200 nm to about 500 nm.

Figure 17:
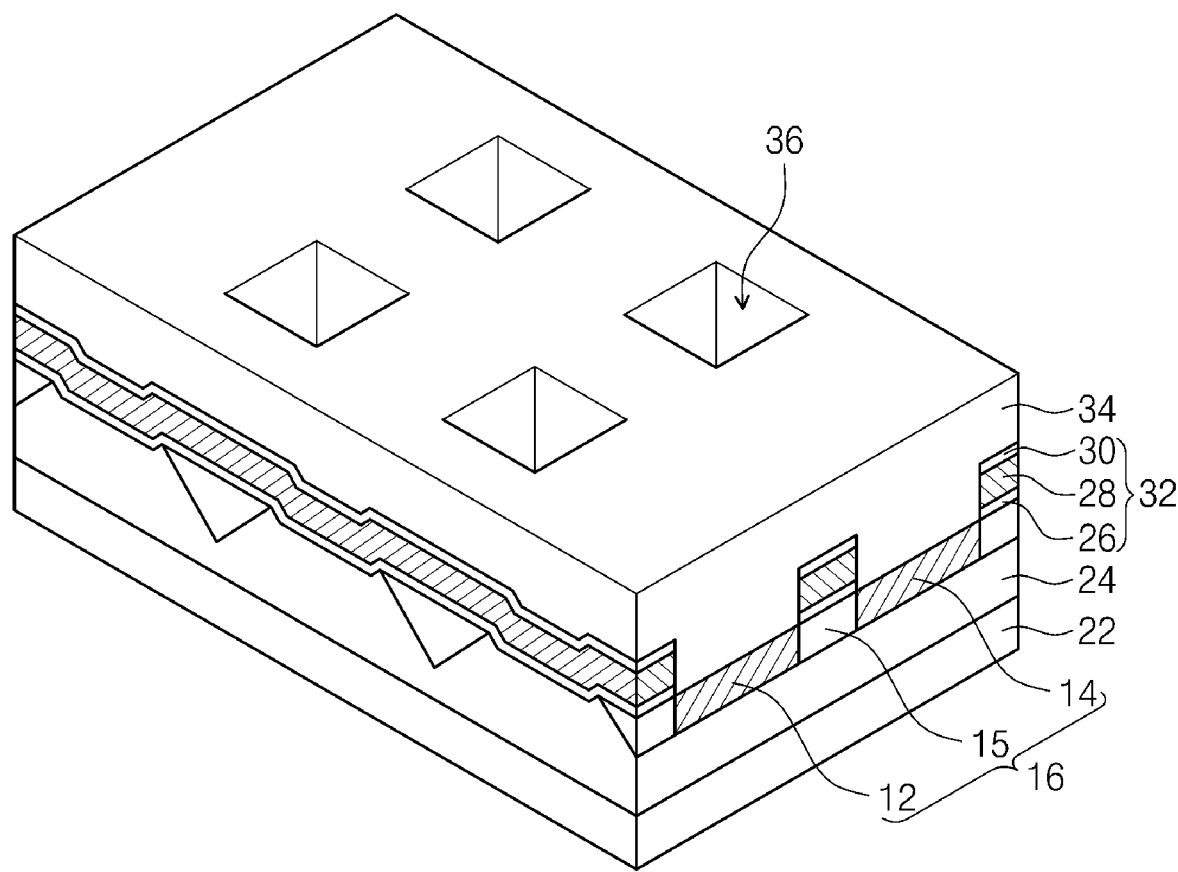

Referring to FIG. 17, a contact hole 36 may be formed by removing the interlayer insulation layer 34 on the source/drain impurity regions 12 and 14. The contact hole 36 is formed by a photolithography process and an etching process. The photolithograph process is performed for forming a photoresist pattern 20 through which the interlayer insulation layer 34 on the source/drain impurity regions 12 and 14 is exposed. The etching process is performed for removing the interlayer insulation layer 34 exposed the photoresist pattern 20 as an etching mask.

Figure 18:
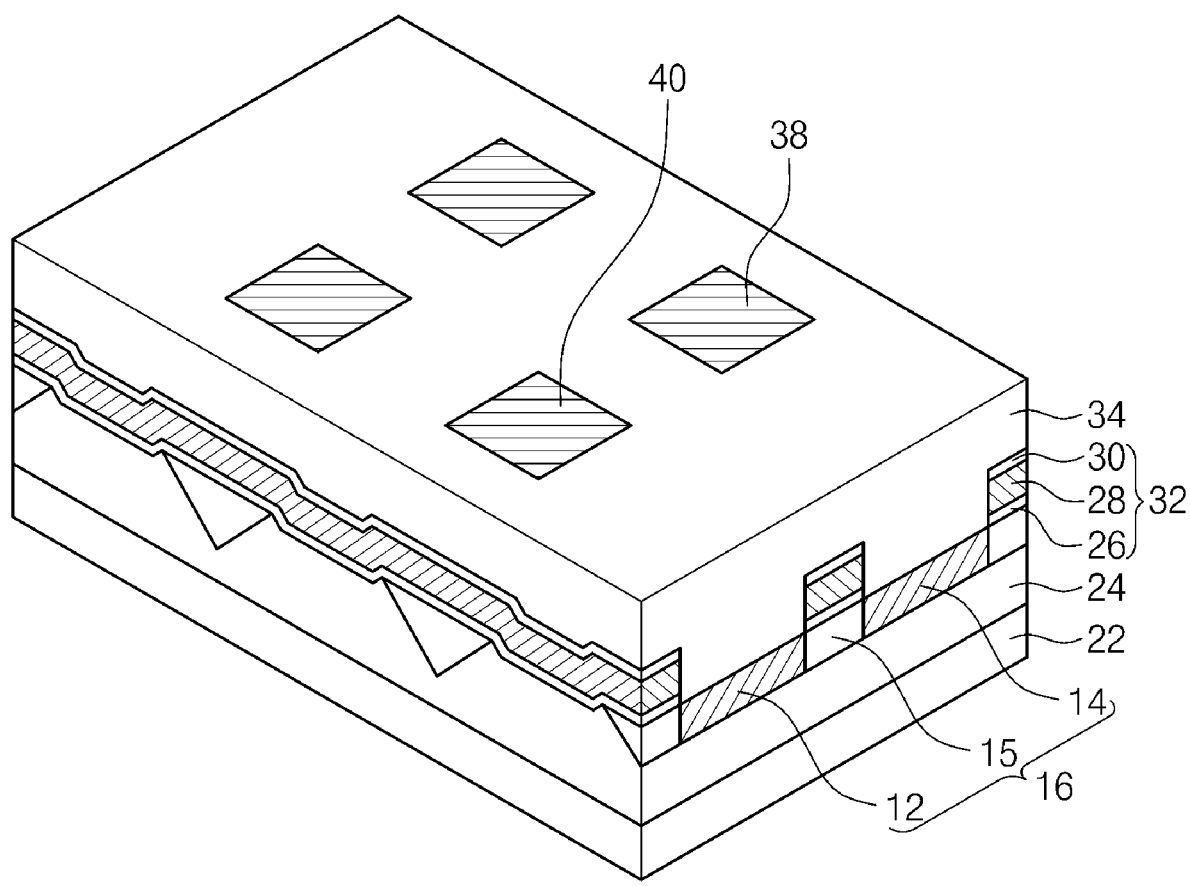

Referring to FIG. 18, source/drain electrodes 38 and 40 may be formed in the contact hole 36. The source/drain electrodes 38 and 40 may include at least one of gold, silver, copper, aluminum, tungsten, tantalum, and titanium, which are formed through a CVD method, a Physical Vapor Deposition (PVD) method, or an electroplating method.

Although not shown in the drawings, a data line or a bit line may be formed on the source electrode 38. At this point, the data line or the bit line, and the source electrode 38 are formed into one body through one photolithography process. After another interlayer insulation layer is formed on the data line or the bit line and the contact hole 36 is formed by removing the interlayer insulation layer on the drain electrode, a pixel electrode connected to the drain electrode 40 exposed through the contact hole can be formed.

As a result, in relation to the method of manufacturing a transferred thin film transistor according to the embodiment of the present invention, the active layer 16 is separated from the silicon wafer having a commercially-excellent 100 shaped plane through a dry etching method and then is transferred to the second substrate 22 of a plastic material, such that productivity can be increased or maximized.

Additionally, after the source/drain impurity regions 12 and 14 are formed on the silicon wafer with a 100 plane and a thermal treatment process of a high temperature is performed, the active layer 16 separated from the silicon wafer by the trench 18 is transferred to the second substrate 22 of a plastic material (which is vulnerable to a high temperature process), such that production yield can be increased or maximized.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of manufacturing a transferred thin film transistor, the method comprising:
    forming a source region and a drain region that extend in a first direction in a first substrate and a channel region between the source region and the drain region;
    forming trenches that extend in a second direction in the first substrate to define an active layer between the trenches, the second direction intersecting the first direction;
    separating the active layer between the trenches from the first substrate by performing an anisotropic etching process on the first substrate inside the trenches;
    attaching the active layer on a second substrate; and
    forming a gate electrode in the first direction on the channel region of the active layer.

2. The method of claim 1, wherein the first substrate comprises a silicon wafer having a 100 shaped plane.

3. The method of claim 2, wherein the trenches have a V-shape, and slopes of the V-shaped trenches include a 111 shaped plane and a 111 shaped plane.

4. The method of claim 3, wherein the trenches are formed through a wet etching method.

5. The method of claim 4, wherein the wet etching method uses Tetramethyl Ammonium Hydroxide (TMAH) as an etchant.

6. The method of claim 2, wherein the separating of the active layer comprises:
    forming a photoresist pattern on the active layer between the trenches; and
    removing the first substrate in the trenches until adjacent trenches are contacted each other by the anisotropic etching process that uses the photoresist pattern as an etching mask.

7. The method of claim 6, wherein the anisotropic etching process comprises a dry etching method.

8. The method of claim 7, wherein the dry etching method uses SF6 as an etching gas of the first substrate.

9. The method of claim 6, wherein the photoresist pattern is formed to have a shade that extends into the trenches on the active layer.

10. The method of claim 9, wherein the shade is formed by reflowing the photoresist pattern on the active layer.

11. The method of claim 6, wherein the separating of the active layer comprises:
    attaching a stamp on the photoresist pattern after the removing of the first substrate in the trenches; and
    separating the photoresist pattern and the active layer from the first substrate.

12. The method of claim 1, further comprising: performing a thermal treatment process of more than about 500° C. on the first substrate after the forming of the source/drain impurity regions.

* * * * *